United States Patent [19]

Chien-heng

[11] Patent Number: 5,165,056
[45] Date of Patent: Nov. 17, 1992

[54] TRANSFORMER WINDING FORM WITH AN INSERTION-TYPE LEADER FRAME

[76] Inventor: Chien Chien-heng, No. 1, Lane 289, Li Nung St., Sec. 2, Pei-Tou, Taipei, Taiwan

[21] Appl. No.: 783,979

[22] Filed: Oct. 29, 1991

Related U.S. Application Data

[62] Division of Ser. No. 696,748, May 7, 1991.

[30] Foreign Application Priority Data

Dec. 15, 1990 [TW] Taiwan ............................ 79213893

[51] Int. Cl.⁵ .................. H01F 15/02; H01F 15/10
[52] U.S. Cl. ................................. 336/65; 174/52.4; 336/192; 336/208; 361/405
[58] Field of Search .............. 174/260, 94 R, 52.4; 361/403, 405; 336/192, 198, 208, 65; 310/71

[56] References Cited

U.S. PATENT DOCUMENTS

| | | | |
|---|---|---|---|
| 3,265,999 | 8/1966 | Kessel | 336/192 |
| 3,445,797 | 5/1969 | Otto | 336/192 |
| 3,562,903 | 2/1971 | Busler et al. | 336/192 |
| 3,848,208 | 11/1974 | Dawson et al. | 336/198 |
| 3,939,362 | 2/1976 | Grimes et al. | 336/198 |
| 4,661,792 | 4/1987 | Watkins | 336/65 |
| 4,890,085 | 12/1989 | Saito et al. | 336/192 |

FOREIGN PATENT DOCUMENTS

| | | | |
|---|---|---|---|
| 639824 | 12/1936 | Fed. Rep. of Germany | 336/192 |
| 61-150304 | 7/1986 | Japan | 336/192 |

Primary Examiner—Thomas J. Kozma
Attorney, Agent, or Firm—Bacon & Thomas

[57] ABSTRACT

A transformer winding form includes an insertion-type leader frame which is attached to the transformer winding form during the process of molding the winding form. The leader frame can be produced in a T-shaped or L-shaped configuration for attachment at the proper position on the transformer winding form. Due to a the lower curved section in the T-shaped leader frame, the thus equipped transformer winding form can be soldered firmly to a PC board, while also having horizontal side terminals which facilitates other connections to the transformer winding form. The horizontal side terminals of the T-shaped configuration also conform to the special layout holes of a PC board, as a result of which the overall height of the transformer winding form is also decreased. In the L-shaped leader frame, the lower vertical terminals underneath can also be inserted into the holes of a PC board and thereby comply with the requirements of large-volume output automatic soldering machines.

3 Claims, 5 Drawing Sheets

TRANSFORMER WINDING FORM WITH AN INSERTION-TYPE LEADER FRAME

This application is a division of application Ser. No. 07/696,748, filed May 7, 1991.

BACKGROUND OF THE INVENTION

The invention relates to a transformer winding form with a unique and innovative insertion-type leader frame which can be fitted onto the body of the transformer winding form. The leader frame is not only resistant to loosening, but also has a larger and more solid soldering area, thereby increasing the permanent implacement characteristics. As a result, the transformer winding form herein meets the requirements of different electronic components, has a lower overall physical height and accommodates the utilization of an increased number of different soldering methods, and the transformer winding coil equipped therewith possesses such advantages as installation convenience, mechanical stability and the capacity to be wound in an automatic coil winding machine.

Most conventional transformers of this type are used in laptop computers, signal transmission in communications products, power supplies and other microelectronic products. The words winding form, in this context, refer specifically to the unwound inductor section of a transformer surrounding an iron core. An example of a commonly known miniature transformer winding form is illustrated in FIG. 7, wherein the body of the form (2a) is first constructed out of injected plastic or bakelite. One end of a circle terminal (1a) is stamped to form a semi-circular tip (4a) or a flat hook-shaped tip, with the semi-circular tip (4a) or flat hook-shaped tip for subsequent insertion into the circle terminal mounting hole (3a) on the form (2a) manually or by a simple tool which facilitates firm anchoring. However, the mounting hole (3a) created to seat the circle terminal (1a) on the winding form is often too large, resulting in the impossibility of tightly seating the circle terminal (1a), and also is easily enlarged even further which causes additional loosening, especially when this type of winding form is soldered into a PC (printed circuit) board, in which case the winding form may often fall off, and make it impossible to attain full transformer efficiency. On the other hand, the mounting hole (3a) produced may be too small, then in addition to causing difficult insertion of the circle terminal (1a), a problem which is compounded, if an accessory tool is utilized to force insertion, because use of the insertion tool might easily result in nicking the surface of the body of the form (2a), shortening the service life and resulting in a poor quality appearance. Therefore, the conventional fabrication of the circle terminal of this type of winding form is not an ideal design. Moreover, use of such a circle terminal may result in inadequately built-up soldering welds due to the small surface area of the circle terminal (1a), causing poor electrical characteristics and unstable mechanical structure.

SUMMARY OF THE INVENTION

Therefore, the main objective of the invention herein is to provide a winding form into which is fit, during the process of injection molding the body of the winding form, a specially made leader frame which is interlocked firmly at the appropriate position on the body of the form, thereby providing a finished unit which will have the external appearance of a single piece, and which will enable the leader frame to be easily inserted and eliminate easy loosening. The specially designed leader frame of the preferred invention has a curved terminal strip portion extending from the bottom that permits an increased surface area for soldering the winding form to a PC board, thereby enabling the winding form to be positioned securely on the PC board, while at the same attaining excellent electrical conductivity efficiency. Furthermore, the preferred leader frame also includes protruding terminal strips on the side which are level with the body of the form. In addition to making possible convenient connection to most types of wire conductors, the protruding terminal strips at the same time also permit connection to the inside of special thin and small electronic components, and also conforms to the layout design of PC board holes, specifically through the utilization of two side terminals which are placed at the rims of the PC board holes, which in this case have the function of lowering the overall height of the winding form body, completely meeting component and circumstantial requirements. The preferred invention thereby constitutes a thorough improvement over the deficient but commonly known products in this category and is based on a new design that is both practical and advanced. In accordance with a second preferred embodiment of the invention, the leader frame is formed with an inverted L-shaped protrusion configured underneath as a perpendicular and downwardly extending lower terminal frame for insertion into the positioned holes on a PC board, thereby enabling soldering through the utilization of an automatic soldering device. In this embodiment the lower section of the leader frame can also be formed into a curved shape as described above and; as such, the leader frame has the built-in capability to be utilized in connection with a variety of mounting methods as noted above, including surface mounting, low-profile mounting and other mounting arrangements, thus supporting a broader range of applications.

In order to enable a more complete understanding of the structure, unique characteristics and other objectives of the invention herein for inspection personnel, the following drawn figures accompanied by detail explanations have been appended:

DETAILED DESCRIPTION OF THE PREFERRED EMBODIMENT

Figure 1:
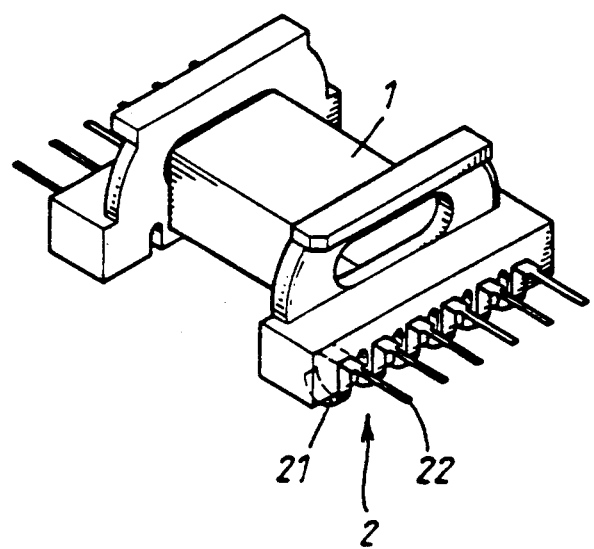
FIG. 1 is a perspective view of a winding form constructed in accordance with a first preferred embodiment of the invention.
Figure 2:
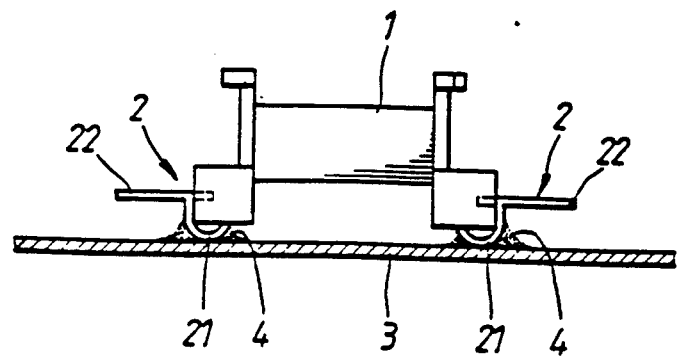
FIG. 2 is an elevated side view showing an arrangement for mounting the preferred winding form of FIG. 1.

Referring to FIG. 1, which depicts the invention as a miniature transformer winding form with an improved insertion-type terminal; (1) is the body of the form alone to which the leader frame (2) is attached by insertmolding during the process of injection molding the body, a process which includes the step of inserting a leader frame at the predetermined position into the body of the form (1). Following the completion of the above production process, and due to the design of the leader frame (2), the leader frame (2) is not easily loosened or jarred off this is accomplished without the disadvantage of difficult insertion of the leader frame (2). The leader frame (2) has a T-shaped profile when viewed from an oblique angle and also includes a curved portion of the lower terminal (21) extending downward underneath the winding form and a side terminal (22) joined firmly to the body of the form (1). The side terminal is level with the tongue fitting protruding from the body of the form (1). As shown in FIG. 2 the curved lower terminal (21) below the leader frame (2) may be soldered to a PC board (3), and due to the increased area of contact between the curved lower terminal (21) and the PC board, the soldered weld (4), is consequently larger in size, and therefore the leader frame (2) can be mounted into position firmly onto the PC board (3). Furthermore, because the soldered connection surface is increased, the leader frame (2) has a higher degree of electrical conductivity, with the advantage that the flow of signal current is enabled to be of maximum continuity.

Figure 3:
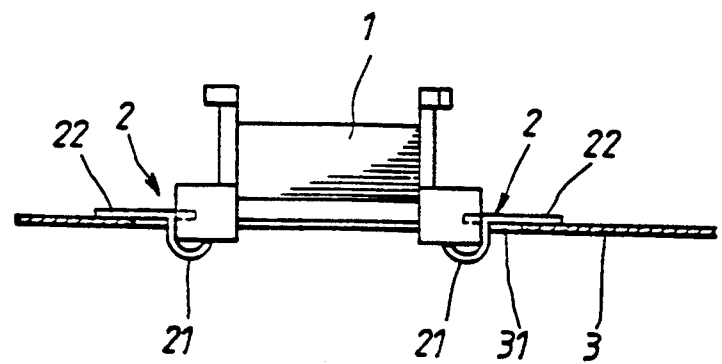
FIG. 3 is an elevated side view showing a second arrangement for mounting the preferred winding form of FIG. 1.

FIG. 3 indicates an alternative mounting arrangement made possible by the fact that the unique design and construction of the leader frame (2), which is level with the protruding side terminal (22) section. In addition to connection to most types of vinyl-insulated wire conductors and insertion into the hole(s) (31) on a conventional PC board (3), and to meet the actual requirements of electronic components, the underside of the winding form can also be mounted into the appropriate holes (31) on the PC board (3), thereby enabling a portion of the underside of the winding form to be lowered into the holes (31), and moreover enabling the side terminals (22) on both sides to be structurally divided for insertion into the opposing holes (31), which are then soldered for added mechanical stability. As a result, the overall height of the winding form is substantially reduced to meet the requirements of thin-film electronic components, and at the same time, with respect to the soldering in of the level and extended side terminals (22) for mechanical stability, the soldering area is three to five times larger than that possible between a typical wire conductor and the PC board (3). Therefore, the transformer winding form herein is capable of attaining stability, efficiency, and an increased scope of application.

Figure 4:
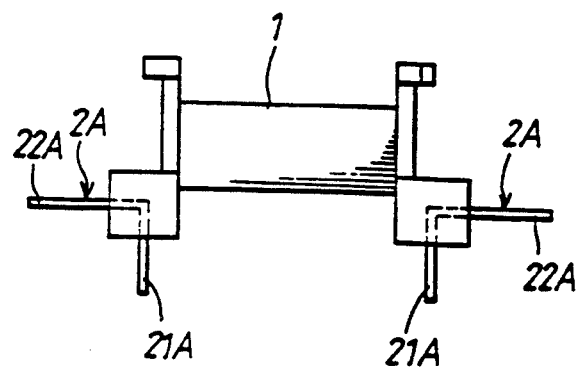
FIG. 4 is an elevated side view showing a winding form constructed in accordance with a second preferred embodiment of the invention.
Figure 5:
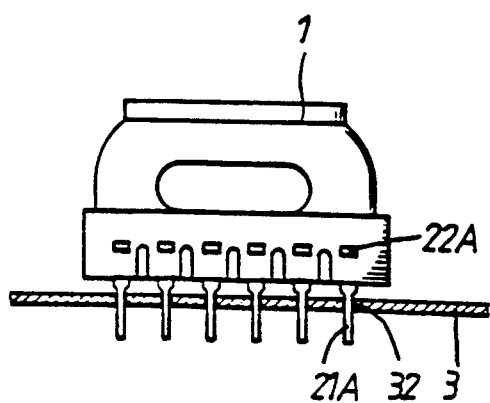
FIG. 5 is an elevated side view of a first arrangement for mounting the preferred winding form of FIG. 4.
Figure 6:
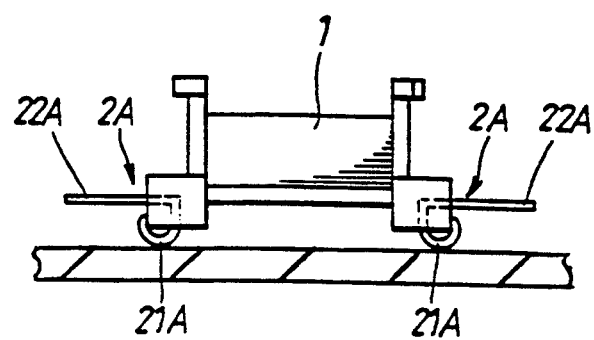
FIG. 6 is an elevated side view of a second arrangement for mounting the preferred winding form of FIG. 4.
Figure 7:
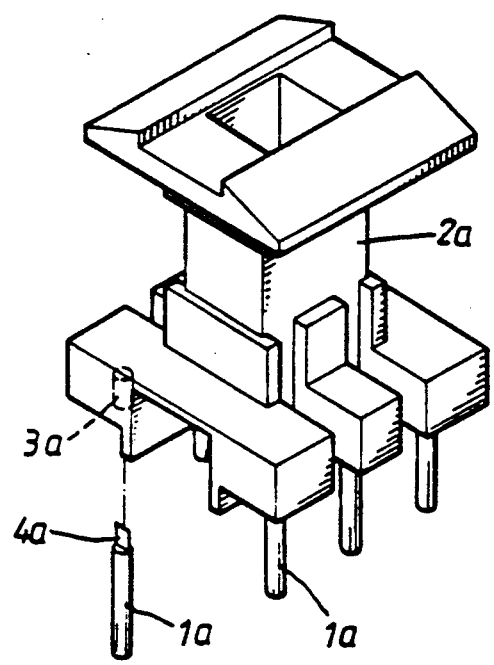
FIG. 7 is a perspective view of a conventional winding form.

FIG. 4 illustrates a second preferred embodiment of the invention in which, the T-shaped leader (2), shown in FIG. 3, is configured into an L-shaped terminal (2A). This perpendicular terminal includes a lower vertical terminal (21A) section and an extended horizontal side terminal (22A) section, of which the lower vertical bottom terminal (21A) can be inserted into the typical positioned terminal (2A) hole (32) on the PC board (3) (as shown in FIG. 5), and further can be soldered to the PC board (3) at an increased soldering speed through the use of high-volume capability automatic soldering devices. As shown in FIG. 6, the lower vertical terminal shaped terminal of FIG. 4 can be bent into the shape of a curve as explained above and thus can also at the same time be utilized for both surface attachment and/or recessed attachment resulting in an increased scope of applications because of a suitability with different kinds of installation methods.

To summarize the descriptions above, the invention herein consists of a transformer winding form with insertion-type leader frame which can be fitted into the body of the winding form thereby advantageously increasing the degree of stable connectivity, increasing the effective soldering area, and decreasing the overall height, while at the same time widening the scope of application. A great number of concrete modifications and improvements can perhaps be made to the invention herein by those knowledgeable about this type of technology, although it will be appreciated that this does not detract from the essential originality so contributed by the invention. Therefore, the extent of the patent rights for the invention herein, for which the application has been duly filed, shall only be limited by the scope of the appended claims.

What is claimed by the invention herein are:

1. A transformer winding form, comprising a main body consisting of a single insert-molded main body member; and a leader frame insert-molded into and therefore embedded and enclosed within the main body member, said main body member including winding support means for supporting a transformer winding, said leader frame comprising T-shaped leads including upper terminal sections extending in a first plane from opposite sides of said main body member, upper insert-molded sections extending into said main body member, and lower terminal sections connected with an perpendicular to said upper terminal and insert-molded sections, said lower terminal sections extending parallel to and adjacent to said sides of said winding form main body member, wherein said upper terminal sections comprise means for terminating a transformer winding wrapped around said winding support means and said lower terminal sections comprise means for electrically connecting said upper terminal sections to circuitry on a circuit board.

2. A transformer winding form as claimed in claim 1, wherein said lower terminal sections include means defining curved sections extending initially away from and then towards a lower surface of said main body member for surface mounting said winding form on a printed circuit board.

3. Apparatus comprising a transformer winding form which includes a main body consisting of a single insert-molded main body member; and a leader frame insert-molded into and therefore embedded and enclosed within the main body member, said main body member including winding support means for supporting a transformer winding, said leader frame comprising T-shaped leads including upper terminal sections extending in a first plane from opposite sides of said main body member, upper insert-molded sections extending into said main body member, and lower terminal sections connected with and perpendicular to said upper terminal and insert-molded sections, said lower terminal section extending parallel to said sides of said winding form main body member, wherein said upper terminal sections comprise means for terminating a transformer winding wrapped around said winding support means; and a printed circuit board having an aperture formed therein, wherein said upper terminal sections include means defining lower surfaces of said upper terminal sections for electrical connection directly to an upper surface of said printed circuit board, said main body member extending into a hole in the circuit board to thereby lower a height by which the mounted winding form extends above the upper surface of the circuit board.

* * * * *